United States Patent
Jang

(10) Patent No.: US 9,564,480 B2
(45) Date of Patent: Feb. 7, 2017

(54) ORGANIC LIGHT EMITTING DISPLAY DEVICE AND MANUFACTURING METHOD THEREOF

(71) Applicant: LG DISPLAY CO., LTD., Seoul (KR)

(72) Inventor: Yi Sik Jang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/584,569

(22) Filed: Dec. 29, 2014

(65) Prior Publication Data

US 2015/0188083 A1    Jul. 2, 2015

(30) Foreign Application Priority Data

Dec. 30, 2013  (KR) .................. 10-2013-0167693

(51) Int. Cl.
*H01L 27/32* (2006.01)
*H01L 51/52* (2006.01)

(52) U.S. Cl.
CPC ....... *H01L 27/3272* (2013.01); *H01L 51/5221* (2013.01)

(58) Field of Classification Search
CPC .. H01L 27/32; H01L 27/3262; H01L 27/3265; H01L 27/322; H01L 27/14609; H01L 27/3206; H01L 27/3211; H01L 27/3225; H01L 27/3244; H01L 27/3258; H01L 27/326;H01L 27/3274; H01L 27/3276; H01L 27/3272; H01L 51/5221
See application file for complete search history.

(56) References Cited

U.S. PATENT DOCUMENTS

| | | | | |
|---|---|---|---|---|
| 8,772,775 B2* | 7/2014 | Park | ................... | H01L 27/1225 257/59 |
| 8,921,230 B2* | 12/2014 | Park | ........................ | C23F 1/18 216/103 |
| 2007/0218601 A1* | 9/2007 | Seo | ..................... | H01L 29/4908 438/151 |

* cited by examiner

*Primary Examiner* — Jose R Diaz
(74) *Attorney, Agent, or Firm* — Birch, Stewart, Kolasch & Birch, LLP

(57) ABSTRACT

A method of fabricating an organic light emitting display device is discussed. The method in one example includes: sequentially forming a first metal film and a second metal film on a substrate and performing a mask procedure for the first and second metal films, to form a gate electrode, a first storage electrode and a pad in a thin film transistor region, a storage capacitor region and a pad region; forming a gate insulation film on the substrate provided with the gate electrode; forming a third storage electrode which overlaps the second storage electrode with a passivation film therebetween and is connected to the drain electrode; forming red, green and blue color filters in respective pixel regions of the substrate; and forming an organic light emitting diode on the substrate provided with the color filter.

12 Claims, 8 Drawing Sheets

ORGANIC LIGHT EMITTING DISPLAY
DEVICE AND MANUFACTURING METHOD
THEREOF

CROSS REFERENCES TO RELATED
APPLICATIONS

The present application claims priority under 35 U.S.C. §119(a) to Korean Patent Application No. 10-2013-0167693 filed in the Republic of Korea on Dec. 30, 2013, which is hereby incorporated by reference in its entirety.

BACKGROUND OF THE INVENTION

Field of the Disclosure

The present application relates to an organic light emitting display device. More particularly, the present application relates to an organic light emitting display device adapted to enhance reliability of elements and reduce the number of mask procedures, and to a method of manufacturing the same.

Description of the Related Art

Recently, flat panel display devices are being developed for replacing cathode ray tube devices (CRTs), which are heavy and have large volume. The flat panel display devices include liquid crystal display (LCD) devices and organic light emitting display (OLED) devices.

OLED devices are self-luminous and do not need an additional light source, unlike LCD devices. As such, OLED devices are thinner, have lighter weight and superior color reproduction ranges when compared to LCD devices. In accordance therewith, the OLED device is being spotlighted as a next generation display device.

OLED devices are generally classified into a passive type and an active type.

The active type of OLED device includes thin film transistors opposite to pixels. As such, the active type OLED device has advantages of lower power consumption and superior definition compared to the passive type OLED device. Therefore, the active type OLED device is mainly used to implement a large-sized image display device.

A display panel of an ordinary OLED device includes sub-pixels arranged in a matrix shape. The sub-pixels can include red, green and blue sub-pixels. Alternatively, the sub-pixels can each include a white sub-pixel and a color conversion layer configured to convert white light of the white sub-pixel into one of red, green and blue lights. Also, the sub-pixels can be of the active type or the passive type. For example, the active type sub-pixel includes a switching transistor configured to transfer a data signal in response to a scan signal, a storage capacitor used to store a data voltage corresponding to the data signal, a driving transistor configured to generate a driving current corresponding to the data voltage, and an organic light emitting diode configured to emit light corresponding to the driving current. Thus, the active type OLED sub-pixel can be formed in a 2T1C (two transistors and one capacitor) structure including the switching transistor, the driving transistor, the capacitor and the organic light emitting diode. Alternatively, the active type sub-pixel can be formed in one of 3T1C, 4T2C and 5T2C structures and so on. Also, the sub-pixel can be formed in one of a top emission mode, a bottom emission mode and a dual emission mode based on a cross-sectional structure.

FIG. 1 is a cross-sectional view showing an etch stopper and a contact hole formed through the same mask procedure in a related art method of manufacturing of an OLED device;

Referring to FIG. 1, a switching transistor or a driving transistor is formed in a thin film transistor structure. Although they are not shown in the drawing, storage electrodes, a pixel electrode and pads are simultaneously formed when the thin film transistor is formed.

The procedure of forming an etch stopper 15 included in the thin film transistor will now be described.

A metal film is formed on a substrate of a transparent insulation material. A gate electrode 11 is formed by performing a mask procedure for the metal film. Also, a gate insulation film 12 is formed on the entire surface of the substrate 10 provided with the gate electrode 11.

Thereafter, a channel layer 14 corresponding to a semiconductor layer is formed on the gate insulation film opposite to the gate electrode 11, and an etch stopper 15 is formed on the channel layer 14. The etch stopper is used to protect the channel layer 14. Also, a contact hole Ck exposing a part of the gate electrode 11 is formed in the gate insulation film 12. In general, the etch stopper 15 and the contact hole Ck are formed through different mask procedures. However, in order to reduce the number of mask procedures, the related art manufacturing method for an OLED device enables the etch stopper 15 and the contact hole Ck to be simultaneously formed.

Also, it is necessary to perform a heat treatment process for the etch stopper 15. The heat treatment process can be performed for the etch stopper which is formed by depositing an insulation layer for the etch stopper 15 and patterning the insulation layer through the mask procedure. Alternatively, the heat treatment process can be performed for an insulation layer deposited for the etch stopper before the insulation layer is patterned into the etch stopper 15 through the mask procedure.

However, it is preferable to perform the heat treatment process for the etch stopper 15 which is completed through the mask procedure. In this instance, the element can obtain superior reliability as shown in FIGS. 4A and 4B.

In view of this point, the related art manufacturing method of the OLED device allows the heat treatment process to be performed for the completed etch stopper 15 as shown in FIG. 1B. However, a part of the gate electrode 11 exposed the contact hole Ck can be damaged due to the heat treatment process.

In other words, the etch stopper 15 is completed through an etching process and the heat treatment process. A part of the gate electrode 11 is externally exposed through the gate contact hole Ck. Due to this, the gate electrode 11 might be damaged during the etching process and the heat treatment process.

Although only the gate electrode 11 shown in the drawing is described, a storage electrode and gate and data pads are formed on the substrate 10 in the same layer as the gate electrode, such that they are partially exposed through respective contact holes. As such, the storage electrode and the gate and data pads can be damaged during the formation procedure of the etch stopper 15.

These damages result in reliability deterioration of the elements and quality deterioration of images.

SUMMARY OF THE INVENTION

Accordingly, embodiments of the present application are directed to an organic light emitting display device and a manufacturing method thereof that substantially obviate one or more of problems due to the limitations and disadvantages of the related art.

The embodiments provide an organic light emitting display device and a manufacturing method thereof which are adapted to prevent damage of a gate electrode, a storage electrode and pads by forming a barrier layer of a conductive oxide semiconductor material on a gate metal film.

The embodiments provide an organic light emitting display device and a manufacturing method thereof which are adapted to enhance reliability of elements and reduce the number of mask procedures by forming a barrier layer of a conductive oxide semiconductor material on a gate electrode, a storage electrode and pads.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

In order to solve the above-mentioned problems of the related art, a manufacturing method of an OLED display device according to an embodiment includes: sequentially forming a first metal film and a second metal film on a substrate and performing a mask procedure for the first and second metal films, to form a gate electrode, a first storage electrode and a pad in a thin film transistor region, a storage capacitor region and a pad region; forming a gate insulation film on the substrate provided with the gate electrode; forming a channel layer on the gate insulation film opposite to the gate electrode; forming an insulation film on the substrate provided with the channel layer; forming an etch stopper disposed on the channel layer and first through third contact holes configured to expose the gate electrode, the first storage electrode and the pad using another mask procedure; forming a source electrode and a drain electrode, which are disposed on the substrate provided with the etch stopper, and a second storage electrode disposed on the gate insulation film opposite to the first storage electrode within the storage capacitor region; forming a third storage electrode which overlaps the second storage electrode with a passivation film therebetween and is connected to the drain electrode; forming red, green and blue color filters in respective pixel regions of the substrate; and forming an organic light emitting diode which is formed on the substrate provided with the color filters and includes a first electrode electrically connected to the third storage electrode, an organic emission layer formed on the first electrode and a second electrode formed on the organic emission layer.

An OLED display device according to another embodiment includes: a gate electrode, a first storage electrode and a pad which are formed on a substrate corresponding to a thin film transistor region, a storage capacitor region and a pad region; barrier layers formed on the gate electrode, the first storage electrode and the pad; a gate insulation film formed on the substrate provided with the barrier layers; a channel layer formed on the gate insulation film opposite to the gate electrode; an etch stopper formed on the channel layer; a source electrode configured to contact one end of the channel layer and one end of the etch stopper; a drain electrode separated from the source electrode, connected to the first storage electrode through the gate insulation film and configured to contact other ends of the channel layer and the etch stopper; a first connective portion connected to a barrier layer on the gate electrode through the gate insulation film; a second storage electrode formed on the gate insulation film opposite to the first storage electrode; a first pad contact layer connected to the pad through the gate insulation film; a passivation film formed on the substrate provided with the first connective portion, the source and drain electrodes, the second storage electrode and the first pad contact layer; a second connective portion connected to the first connective portion through the passivation film; a third storage electrode connected to the drain electrode through the passivation film and overlapping the second storage electrode; a second pad contact layer connected to the first pad contact layer through the passivation film; a color filter formed in a pixel region of the substrate provided with the second connective portion, the third storage electrode and the second pad contact layer; and an organic light emitting diode which is formed on the substrate provided with the color filter and includes a first electrode electrically connected to the third storage electrode, an organic emission layer formed on the first electrode and a second electrode formed on the organic emission layer.

Other systems, methods, features and advantages will be, or will become, apparent to one with skill in the art upon examination of the following figures and detailed description. It is intended that all such additional systems, methods, features and advantages be included within this description, be within the scope of the present invention, and be protected by the following claims. Nothing in this section should be taken as a limitation on those claims. Further aspects and advantages are discussed below in conjunction with the embodiments. It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the embodiments and are incorporated herein and constitute a part of this application, illustrate embodiment(s) of the present invention and together with the description serve to explain embodiments of the invention. In the drawings.

DETAILED DESCRIPTION OF THE EMBODIMENTS

Figure 1A:
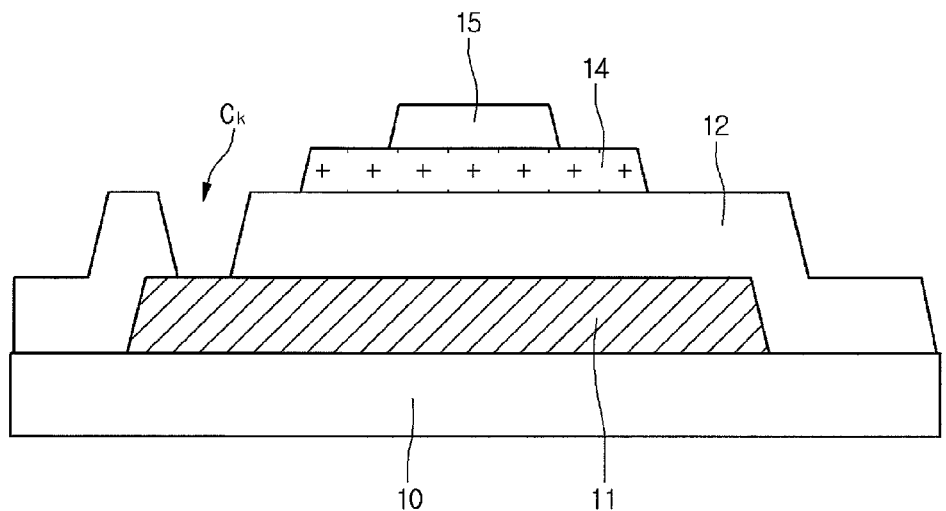
FIG. 1A is a cross-sectional view showing an etch stopper and a contact hole formed through the same mask procedure in a related art method of manufacturing of an OLED device.
Figure 1B:
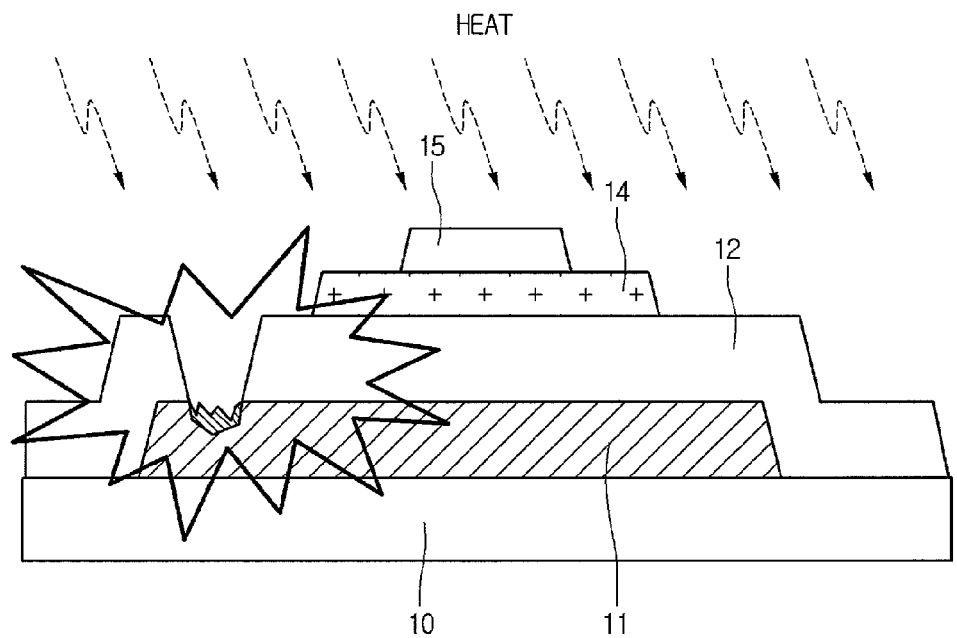
FIG. 1B is a cross-sectional view illustrating a heat treatment process of the related art OLED device manufacture method being performed after the formation of an etch stopper.

Reference will now be made in detail to embodiments of the present invention, examples of which are illustrated in the accompanying drawings. These embodiments introduced hereinafter are provided as examples in order to convey their spirits to the ordinary skilled person in the art. Therefore, these embodiments might be embodied in a different manner, so that they are not limited to these embodiments described here. Also, the size and thickness of the device might be exaggerated for the sake of convenience in the drawings. Wherever possible, the same reference numbers will be used throughout this disclosure including the drawings to refer to the same or like parts.

FIGS. 2A through 2K are cross-sectional views illustrating an OLED manufacture method according to an embodiment of the present invention.

Referring to FIGS. 2A through 2K, the OLED device manufacture method according to an embodiment of the invention forms a gate electrode 101 on a substrate 100. The substrate 100 is formed from a transparent insulation material. The gate electrode 101 can be prepared by forming a gate metal film on the substrate 100 and performing a first mask procedure for the gate metal film. At the same time, not only is a first storage electrode 131 formed on the substrate 100 opposite to a storage capacitor region but also a pad 170 is formed on the substrate 100 opposite to a pad region. The pad 170 can be a pad for one of a gate line, a data line and a power supply line.

The gate metal film can include at least two metal films.

For example, the gate metal film can be formed in a triple layered structure including sequentially stacked first through third metal layers. The first metal layer can be formed from a molybdenum alloy such as molybdenum-titanium MoTi. The second metal layer can be formed from an opaque conductive material with a low resistance. For example, the second metal layer can be formed from one of aluminum Al, an aluminum alloy, tungsten W, copper Cu, nickel Ni, chromium Cr, molybdenum Mo, titanium Ti, platinum Pt, and tantalum Ta. The third metal layer can be formed from a conductive oxide semiconductor or a metal oxide. The conductive oxide semiconductor can be one of indium-gallium-zinc-oxide IGZO, zinc oxide ZnO, and titanium oxide TiO. The metal oxide can be one of indium-tin-oxide ITO and indium-zinc-oxide IZO.

Alternatively, the gate electrode 101, the first storage electrode 131 and the pad 170 can be formed in a double layered structure which includes a first metal layer formed from an opaque conductive material with a low resistance and a second metal layer formed from one of a conductive oxide semiconductor and a metal oxide. The opaque conductive material of the low resistance can be one of a molybdenum-titanium alloy, aluminum Al, an aluminum alloy, tungsten W, copper Cu, nickel Ni, chromium Cr, molybdenum Mo, titanium Ti, platinum Pt, tantalum Ta and alloys thereof. The conductive oxide semiconductor can be one of indium-gallium-zinc-oxide IGZO, zinc oxide ZnO and titanium oxide TiO. The metal oxide can be one of indium-tin-oxide ITO, indium-zinc-oxide IZO and indium-tin-zinc-oxide ITZO.

Figure 3A:
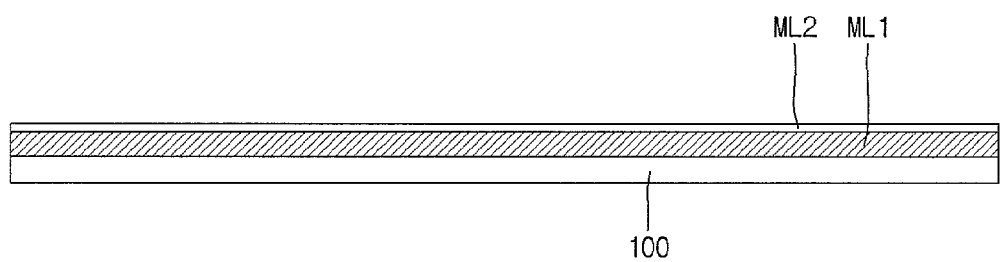
FIGS. 3A through 3D are cross-sectional views illustrating in detail a procedure of manufacturing a gate electrode, a storage electrode and pads of an OLED device according to an embodiment of the present invention.
Figure 3B:
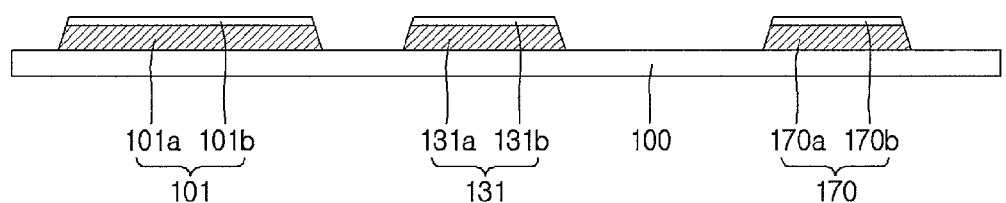

In this instance, the gate electrode 101 is configured with a gate electrode pattern 101a and a gate barrier layer 101b as shown in FIG. 3B. Similarly, the first storage electrode 131 is configured with a storage electrode pattern 131a and a storage barrier layer 131b, and the pad 170 is configured with a pad electrode pattern 170a and a pad barrier layer 170b.

In other words, the gate electrode 101, the storage electrode 131 and the pad 170 are each covered with a barrier layer which is formed from an oxide semiconductor.

Figure 2A:
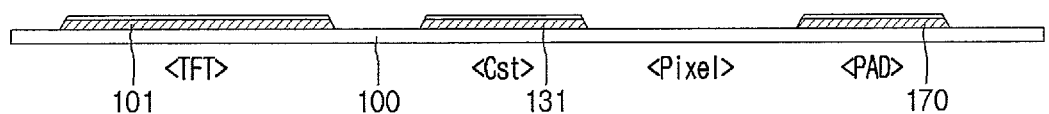
FIGS. 2A through 2K are cross-sectional views illustrating an OLED manufacture method according to an embodiment of the present invention.
Figure 2B:
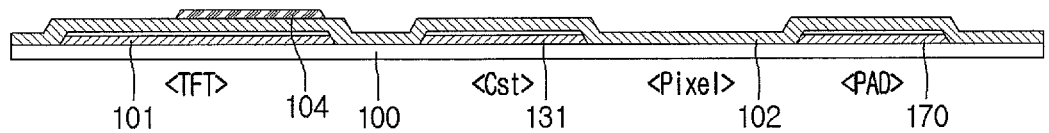

After the gate electrode 101, the first storage electrode 131 and the pad 170 are formed on the substrate 100 as described above, a gate insulation film 102 is formed on the entire surface of the above-mentioned substrate 100 as shown in FIG. 2B. Also, a channel layer 104 is formed on the gate insulation film 102 opposite to the gate electrode 101.

The gate insulation film 102 can be formed from a silicon oxide SiOx and in a single layer structure. Alternatively, the gate insulation film 102 can be formed in a multi-layered structure by alternately depositing a silicon nitride SiNx and a silicon oxide SiOx.

The channel layer 104 can be a semiconductor layer including a crystalline silicon layer and an ohmic contact layer. Alternatively, the channel layer 104 can be formed from an oxide semiconductor layer.

The oxide semiconductor layer can be formed from an amorphous oxide which includes at least one of Indium In, zinc Zn, gallium Ga and hafnium Hf. For example, if the oxide semiconductor layer is formed from the oxide semiconductor of Ga—In—Zn—O through a sputtering process, three targets formed of In2O3, Ga2O3 and ZnO or a single target formed from Ga—In—Zn oxide can be used in the sputtering process. Alternatively, the oxide semiconductor layer can be formed through the sputtering process which uses either three targets formed from HfO2, In2O3 and ZnO or a single target formed from Hf—In—Zn oxide.

Figure 2C:
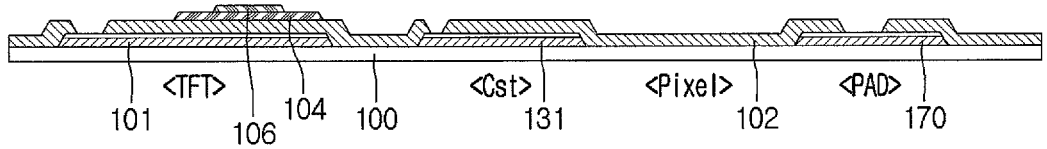

When the channel layer 104 is formed on the gate insulation film 102 as described above, an etch stopper 106 is formed on the channel layer 104 as shown in FIG. 2C. The etch stopper 106 can be prepared by depositing an insulation layer on the entire surface of the above-mentioned substrate 100 and then performing a mask procedure for the insulation layer.

At this time, contact holes partially exposing the gate electrode 101, the first storage electrode 131 and the pad 170 are simultaneously formed. As such, the OLED device manufacture method can reduce the number of mask procedures.

Subsequently, a heat treatment process is performed for the etch stopper 106 in order to harden the etch stopper 106. During the formation of the etch stopper 106 in the related art, the gate electrode 101, the storage electrode 131 and the pad 170, which are exposed through the contact holes, are damaged due to an etching process and the heat treatment process. This results from the fact that the gate electrode 101, the storage electrode 131 and the pad are not covered with any barrier layer in the related art.

In contrast, the gate electrode 101, the storage electrode 131 and the pad 170 of the present invention can be covered with barrier layers formed from a conductive oxide semiconductor. As such, the gate electrode 101, the storage electrode 131 and the pad 170 are not damaged during the formation of the etch stopper 106.

Figure 2D:
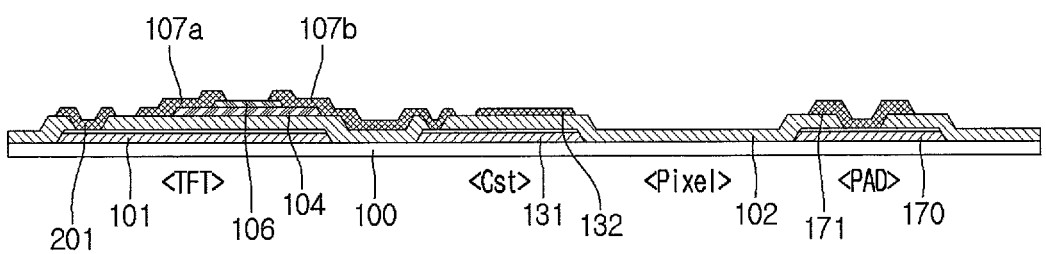

When the etch stopper 106 is formed on the substrate 100 as described above, a source electrode 107a and a drain electrode 107b are formed at both ends of the channel layer 104 by forming a source/drain metal film on the entire surface of the above-mentioned substrate 100 and then performing a mask procedure for the source/drain metal film, as shown in FIG. 2D. In accordance therewith, a thin film transistor is completed. The drain electrode 107b is electrically connected to the storage electrode 131 through the respective contact hole. Such a thin film transistor can be one of a switching transistor and a driving transistor formed in a pixel region of the OLED device.

Also, a connective portion 201 is formed into the contact hole exposing a part of the gate electrode 101. A second storage electrode 132 is formed on the gate insulation film 102 opposite to the first storage electrode 131. A first pad contact layer 171 is formed into the respective contact hole exposing a part of the pad 170.

In addition, a data line and a power supply line can be simultaneously formed when the source/drain electrodes 107a and 107b are formed.

The source/drain metal film can be formed from an opaque conductive material with a low resistance. For example, the source/drain metal film can be formed from one of aluminum Al, an aluminum alloy, tungsten W, copper Cu, nickel Ni, chromium Cr, molybdenum Mo, titanium Ti, platinum Pt, tantalum Ta and so on. Alternatively, the source/drain metal film can be formed in a double layered structure which includes a stacked transparent conductive material layer and an opaque conductive material layer. The transparent conductive material layer can be formed from indium-tin-oxide ITO and indium-zinc-oxide IZO.

Figure 2E:
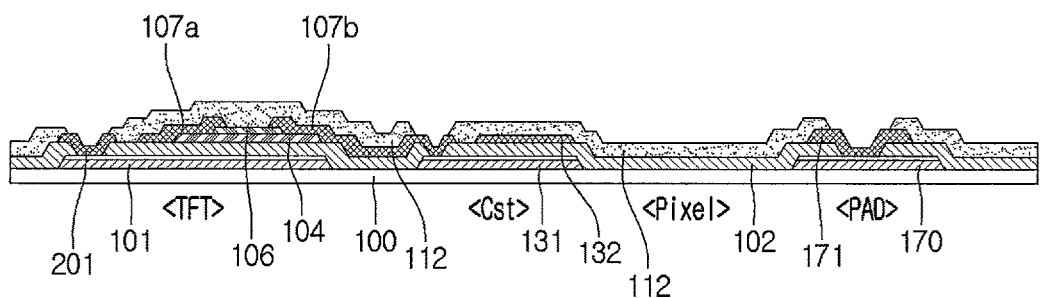

After the source electrode 107a and the drain electrode 107b are formed on the substrate 100, a passivation film 112 can be formed on the entire surface of the above-mentioned substrate 100 as shown in FIG. 2E. Also, contact holes exposing the first connective portion 201 in contact with the gate electrode 101, the drain electrode in contact with the first storage electrode 131 and the first pad contact layer 171 in contact with the pad 170 are formed in the passivation film by performing a mask procedure for the passivation film 112.

Figure 2F:
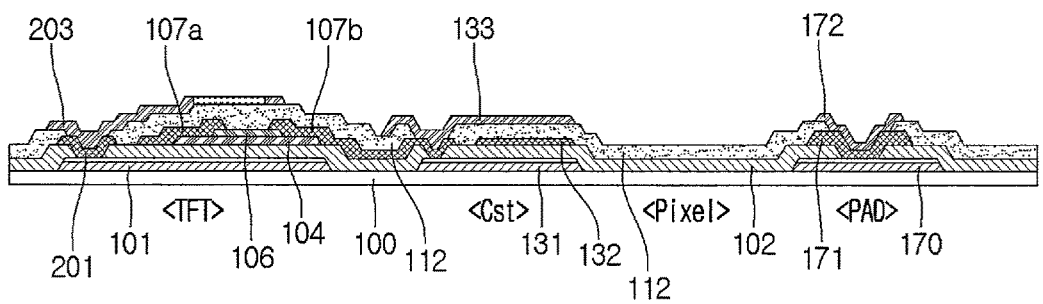
Figure 2G:
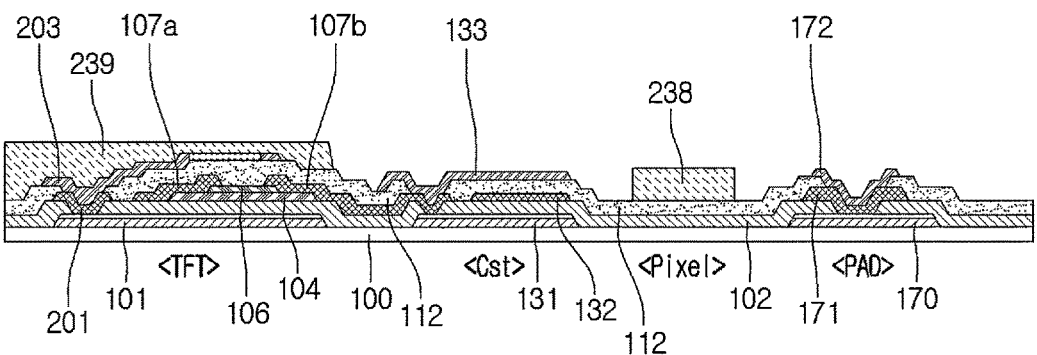

Afterward, a metal film is formed on the substrate provided with the contact holes, and a mask procedure is performed for the metal film. As such, a second connective portion 203 is stacked on the first connective portion 201, a third storage electrode 133 is disposed on the passivation film opposite to the second storage electrode 132, and a second pad contact layer 172 is stacked on the first pad contact layer 171 as shown in FIG. 2F.

The second connective portion 203 can be connected to a gate electrode of a different transistor which is formed in the respective pixel region. The different transistor can be one of another switching transistor and a driving transistor.

The third storage electrode 133 overlaps with the first and second storage electrodes 131 and 132. Also, the third storage electrode 133 is electrically connected to the drain electrode 107b.

Figure 2H:
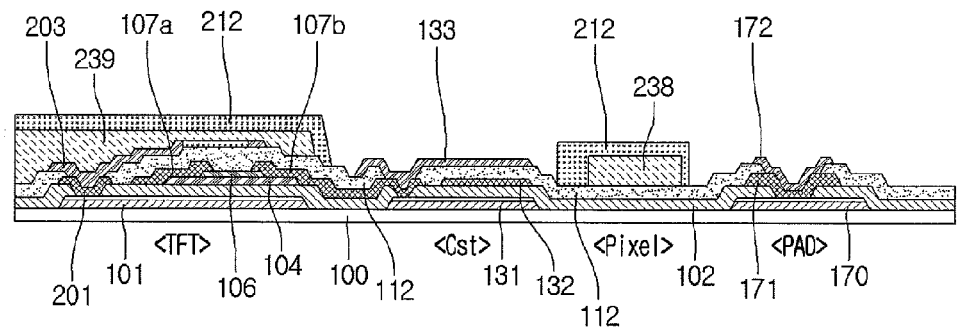

Thereafter, a red color filter 238 is formed in a pixel region by coating a red color resin on the above-mentioned substrate and then performing light exposure and development processes for the coated red color resin. Also, a red color filter 239 is formed on the above-mentioned substrate 100 opposite to the thin film transistor occupying a non-display region, as shown in FIG. 2H.

In the same way, a green color filter and a blue color filter are sequentially formed on the above-mentioned substrate 100 opposite to the thin film transistors occupying different non-display regions.

Also, an overcoat layer 212 is formed on the entire surface of the substrate 100 provided with the color filters. The overcoat layer 212 can be used to planarize the upper surface of the substrate 100.

Figure 2I:
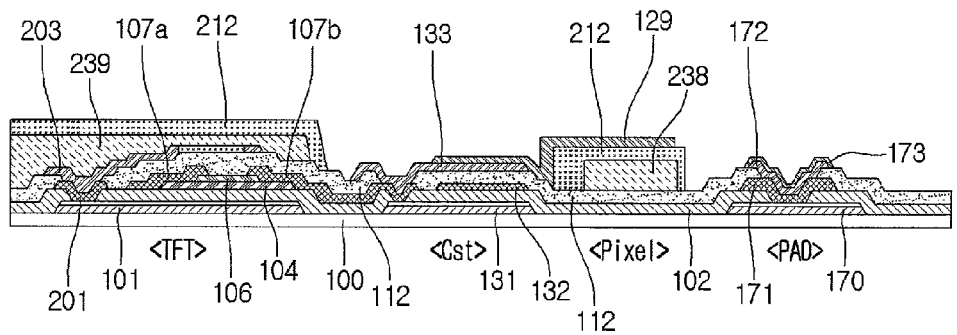

Subsequently, a first electrode 129 and a third pad contact layer 173 are formed by depositing a transparent conductive material on the entire surface of the above-mentioned substrate 100 and then performing a mask procedure for the deposited transparent conductive material, as shown in FIG. 2I. The first electrode 129 is formed on the overcoat layer 212 opposite to the red color filter 238, and the third pad contact layer 173 is formed on the second pad contact layer 172.

If the OLED device is a bottom emission mode OLED device, the first electrode 129 can be used as a cathode electrode.

Figure 2J:
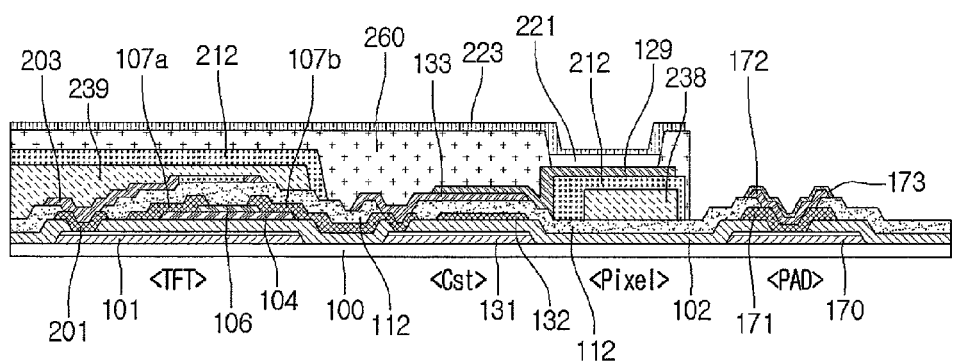

After the first electrode 129 is formed on the pixel region of the above-mentioned substrate 100 as described above, a bank layer 260 is formed by forming an insulation layer on the entire surface of the above-mentioned substrate 100 and then performing a mask procedure for the insulation layer, as shown in FIG. 2J. The bank layer 260 exposes the respective sub-pixel region. As such, the first electrode 129 corresponding to a sub-pixel region size is exposed through the bank layer 260.

Also, an organic emission layer 221 is formed on the exposed surface of the first electrode 129. Moreover, a second electrode 223 is formed on the entire surface of the substrate 100 provided with the organic emission layer 221, as shown in FIG. 2J. In accordance therewith, an organic light emitting diode OL configured with the first and second electrodes 129 and 223 and the organic emission layer 221 is completed.

The organic emission layer 221 can include a hole injection layer HIL, a hole transport layer HTL, an emission layer EML, an electron transport layer ETL and an electron injection layer EIL. An electron blocking layer EBL is included in the hole transport layer HTL. The electron transport layer ETL is formed from a low molecular material. For example, the electron transport layer ETL can be formed from one of PBD, TAZ, Alq3, BAIq, TPBI and Bepp2.

The emission layer EML of the organic emission layer 221 can emit color light in accordance with the formation material of the emission layer EML. In order to realize full color, red, green and blue emission layers can be formed in respective sub-pixel regions. Alternatively, the emission layer EML can become a white emission layer which is formed by stacking red, green and blue organic materials.

As the color filters are formed in the sub-pixel regions, the emission layer EML of the present invention can emit white light.

Figure 2K:
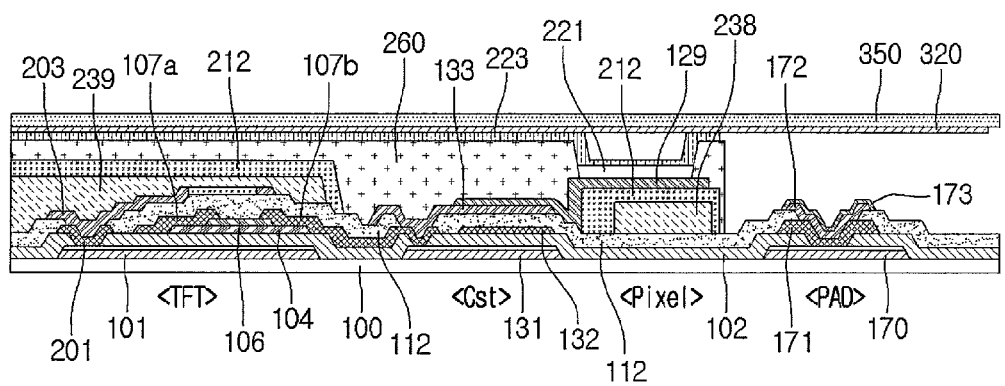

Thereafter, a capping film 350 is attached on the above-mentioned substrate 100 using an adhesive layer 320 as shown in FIG. 2K.

In this way, the OLED device manufacture method of the present invention can allow a barrier layer of a conductive oxide semiconductor to be formed on the gate metal film which is formed on the substrate. As such, damage to the gate electrode, the storage electrode and the pad during the manufacture procedure can be prevented.

Also, the OLED device manufacture method of the present invention can enable the barrier layer of a conductive oxide semiconductor to be formed on the gate electrode, the storage electrode and the pad which are formed on the substrate. In accordance therewith, the number of mask procedures can be reduced and reliability of the elements can be enhanced.

FIGS. 3A through 3D are cross-sectional views illustrating in detail a procedure of manufacturing a gate electrode, a storage electrode 131 and pads of an OLED device according to an embodiment of the present invention.

Referring to FIGS. 3A through 3D, a gate electrode 101, a storage electrode and a pad 170 can be formed by sequentially forming a first metal film ML1 and a second metal film ML2 on a substrate and then performing a mask procedure for the first and second metal films ML1 and ML2.

The first metal film ML1 can be formed to have a single metal layer or two metal layers. The second metal film ML2 can be formed from an oxide semiconductor with a conductive property. Preferably, the oxide semiconductor is a material with an oxygen partial pressure of 0%.

As shown in FIG. 3B, the gate electrode 101 is configured with a gate electrode pattern 101a and a gate barrier layer 101b. The first storage electrode 131 is configured with a storage electrode pattern 131a and a storage barrier layer 131b. The pad 170 is configured with a pad pattern 170a and a pad barrier layer 170b.

The gate electrode pattern 101a, the storage electrode pattern 131a and the pad pattern 170a can be formed to each have a single metal layer. Alternatively, the gate electrode pattern 101a, the storage electrode pattern 131a and the pad pattern 170a can be formed in a double layered structure which includes stacked two metal layers.

Upper surfaces of the gate electrode pattern 101a, the storage electrode pattern 131a and the pad pattern 170a can be covered with barrier layers which are formed from an oxide semiconductor. In other words, the upper surface layers of the gate electrode 101, the first storage electrode 131 and the pad 170 are formed from an oxide semiconductor and used as barrier layers.

Figure 3C:
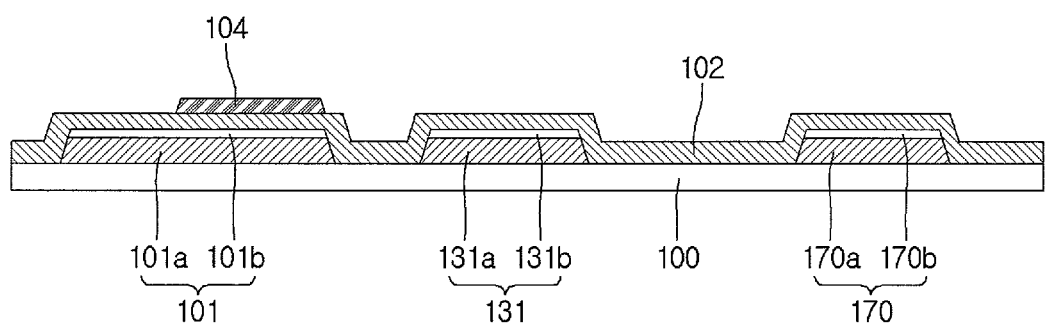

After the gate electrode pattern 101a, the storage electrode pattern 131a and the pad pattern 170a are formed on the substrate 100 as described above, a gate insulation film 102 can be formed on the entire surface of the above-mentioned substrate 100 as shown in FIG. 3C. Also, a channel layer 104 can be formed on the gate insulation film 102 opposite to the gate electrode 101.

Figure 3D:
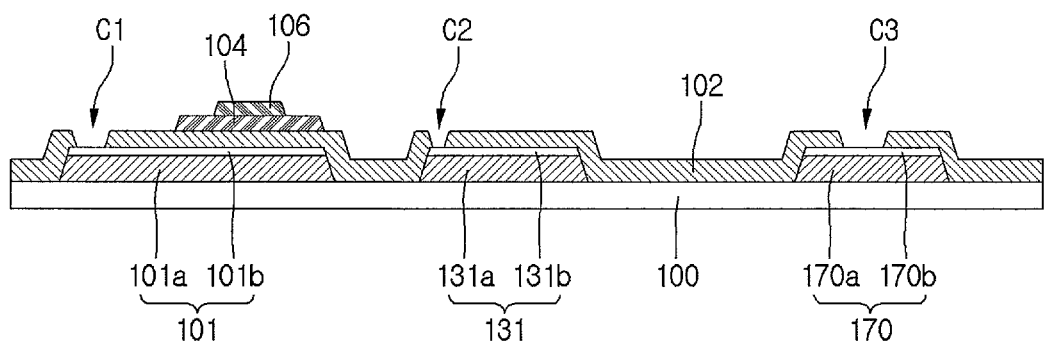

Thereafter, an etch stopper 106 can be formed on the channel layer 104 by forming an insulation layer on the entire surface of the substrate 100 provided with the channel layer 104 and then performing a mask procedure for the insulation layer, as shown in FIG. 3D.

At the same time, the present invention can allow first through third contact holes C1, C2 and C3 partially exposing the gate electrode 101, the storage electrode 131 and the pad 170 to be simultaneously formed together with the etch stopper 106. As such, the number of mask procedures used in the OLED device manufacture method of the present invention can be reduced.

Subsequently, a heat treatment process can be performed for the entire surface of the substrate 100 including the etch stopper 106, in order to harden the etch stopper 106. When the etch stopper 106 is hardened, the gate electrode 101, the storage electrode 131 and the pad 170 can be externally exposed by the first through third contact holes C1, C2 and C3.

However, the present invention enables the upper surfaces of the gate electrode 101, the storage electrode 131 and the pad 170 to be covered with the respective barrier layers 101b, 131b and 170b which are formed from an oxide semiconductor with a conductive property. As such, the gate electrode 101, the storage electrode 131 and the pad 170 are not damaged during an etching process and the heat treatment process.

Figure 4A:
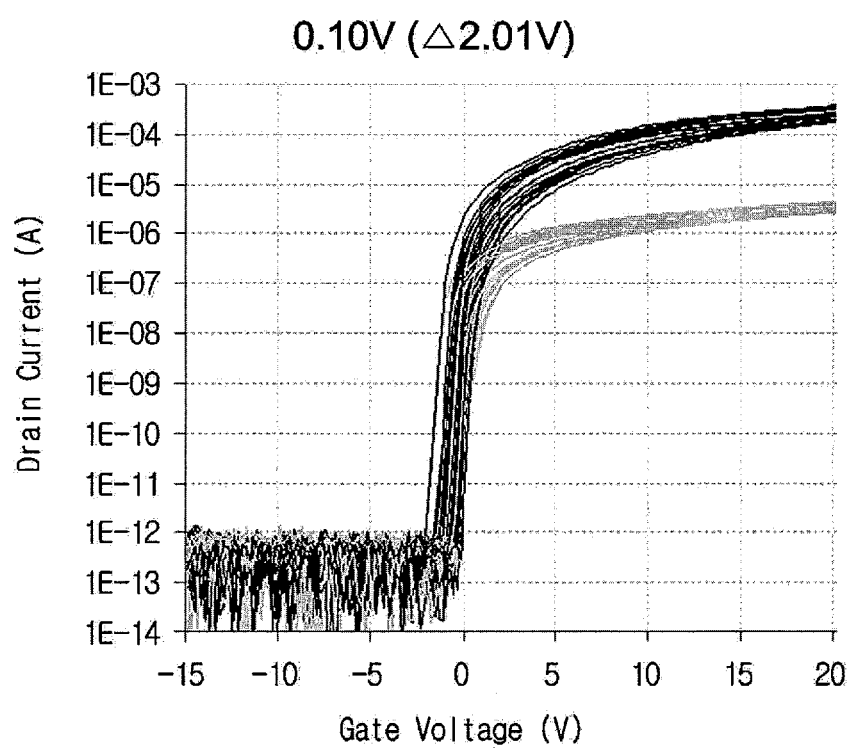
FIGS. 4A and 4B are data sheets comparatively illustrating characteristics of an element in accordance with performing time points of a heat treatment process for an etch stopper which is included in an OLED device of the present invention.
Figure 4B:
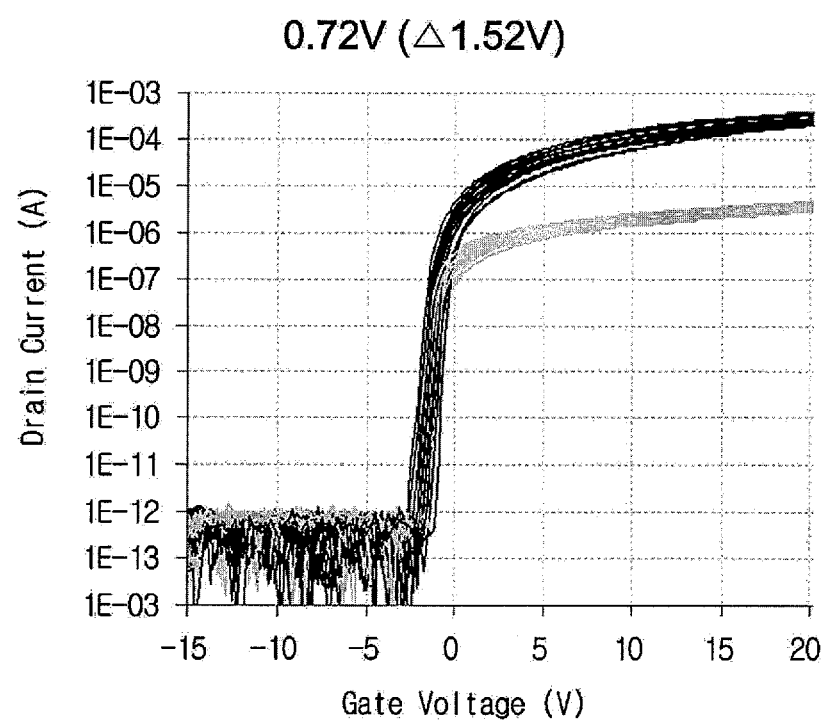

FIGS. 4A and 4B are data sheets comparatively illustrating characteristics of an element in accordance with performing time points of a heat treatment process for an etch stopper which is included an OLED device of the present invention.

The formation procedure of the etch stopper includes a heat treatment process. In more detail, the etch stopper can be formed by depositing the insulation layer and performing the heat treatment process for the insulation layer before the etching process of the insulation layer, as described in FIGS. 3A through 3D. Alternatively, the etch stopper can be formed by depositing the insulation layer and etching the insulation layer before the heat treatment process of the patterned etch stopper. In other words, the heat treatment process is performed before or after the etching process in the formation of the etch stopper.

FIG. 4A illustrates a threshold voltage property of a transistor when the etch stopper is formed by depositing the insulation layer on the substrate and performing the heat treatment process before the etching process. In this instance, the transistor has a deviation of the threshold voltage Vth corresponding to about 1.0V (Δ2.0V) as shown in FIG. 4A. Due to this, reliability of the transistor cannot satisfy a desired degree.

However, if the etch stopper is formed by depositing the insulation layer and patterning the insulation layer through the etching process before the heat treatment process, the transistor has a threshold voltage property as illustrated in FIG. 4B. Referring to FIG. 4B, the transistor has a deviation of the threshold voltage Vth corresponding to about −0.72V (Δ1.52V). As such, it is evident that the transistor secures superior reliability.

In this way, the present invention can allow the heat treatment process to be performed after the formation of the etch stopper. As such, the etch stopper and the contact holes can be formed through a single (or the same) mask procedure. In accordance therewith, not only reliability of the elements can be enhanced but also the number of mask procedures can be reduced.

Also, the OLED device manufacture method of the present invention can allow a barrier layer of a conductive oxide semiconductor to be formed on the gate metal film which is formed on the substrate. As such, damage to the gate electrode, the storage electrode and the pad during the manufacture procedure can be prevented.

Moreover, the OLED device manufacture method of the present invention can enable the barrier layer of a conductive oxide semiconductor to be formed on the gate electrode, the storage electrode and the pad which are formed on the substrate. In accordance therewith, the number of mask procedures can be reduced and reliability of the elements can be enhanced.

Although embodiments have been described with reference to a number of illustrative embodiments thereof, it should be understood that numerous other modifications and embodiments can be devised by those skilled in the art that will fall within the spirit and scope of the principles of this invention. More particularly, various variations and modifications are possible in the component parts and/or arrangements of the subject combination arrangement within the scope of the invention, the drawings and the appended claims. In addition to variations and modifications in the component parts and/or arrangements, alternative uses will also be apparent to those skilled in the art.

What is claimed is:
1. An organic light emitting display device comprising:
an electrode pattern on a substrate;
a barrier layer on the electrode pattern;
an insulation film on the substrate and covering the barrier layer and having a contact hole on the barrier layer, wherein the barrier layer is formed from a conductive oxide, and
wherein the conductive oxide is one of indium gallium zinc oxide (IGZO), zinc oxide (ZnO) and titanium oxide (TiO);
a channel layer on the insulation film;
an etch stopper on the channel layer;

a drain electrode configured to contact one end of the channel layer and one end of the etch stopper; and an organic light emitting diode which is disposed over the substrate and includes a first electrode electrically connected to the drain electrode, an organic emission layer formed on the first electrode and a second electrode on the organic emission layer.

2. The organic light emitting display device of claim 1, wherein the electrode pattern includes at least two metal layers.

3. The organic light emitting display device of claim 2, wherein the at least two metal layers are each formed from one of a molybdenum-titanium alloy MoTi, aluminum Al, an aluminum alloy, tungsten W, copper Cu, nickel Ni, chromium Cr, molybdenum Mo, titanium Ti, platinum Pt and tantalum Ta.

4. An organic light emitting display device comprising:
a gate electrode, a first storage electrode and a pad which are disposed on a substrate corresponding to a thin film transistor region, a storage capacitor region and a pad region, respectively;
barrier layers on the gate electrode, the first storage electrode and the pad;
a gate insulation film on the substrate provided with the barrier layers;
a channel layer on the gate insulation film opposite to the gate electrode;
an etch stopper on the channel layer;
a source electrode configured to contact one end of the channel layer and one end of the etch stopper;
a drain electrode separated from the source electrode, connected to the first storage electrode through the gate insulation film and configured to contact other ends of the channel layer and the etch stopper;
a first connective portion connected to a barrier layer on the gate electrode through the gate insulation film;
a second storage electrode on the gate insulation film opposite to the first storage electrode;
a first pad contact layer connected to the pad through the gate insulation film;
a passivation film on the substrate provided with the first connective portion, the source and drain electrodes, the second storage electrode and the first pad contact layer;
a second connective portion connected to the first connective portion through the passivation film;
a third storage electrode connected to the drain electrode through the passivation film and overlapping the second storage electrode;
a second pad contact layer connected to the first pad contact layer through the passivation film;
a color filter in a pixel region of the substrate provided with the second connective portion, the third storage electrode and the second pad contact layer; and
an organic light emitting diode on the substrate provided with the color filter and includes a first electrode electrically connected to the third storage electrode, an organic emission layer on the first electrode and a second electrode on the organic emission layer.

5. The organic light emitting display device of claim 4, wherein the barrier layers are formed from a conductive oxide.

6. The organic light emitting display device of claim 5, wherein the conductive oxide is one of indium gallium zinc oxide IGZO, zinc oxide ZnO and titanium oxide TiO.

7. The organic light emitting display device of claim 4, wherein the gate electrode includes at least two metal layers.

8. The organic light emitting display device of claim 4, wherein gate electrode is formed in a single layer which is formed from one of an alloy of molybdenum and titanium MoTi, aluminum Al, an aluminum alloy, tungsten W, copper Cu, nickel Ni, chromium Cr, molybdenum Mo, titanium Ti, platinum Pt and tantalum Ta.

9. The organic light emitting display device of claim 4, wherein the gate electrode is formed in a double layered structure configured with stacked metal layers which are each formed from one of a molybdenum-titanium alloy MoTi, aluminum Al, an aluminum alloy, tungsten W, copper Cu, nickel Ni, chromium Cr, molybdenum Mo, titanium Ti, platinum Pt and tantalum Ta.

10. The organic light emitting display device of claim 4, the etch stopper is hardened through a heat treatment process before the source and drain electrodes are formed.

11. The organic light emitting display device of claim 4, wherein the etch stopper is hardened through a heat treatment process after the etch stopper is formed.

12. The organic light emitting display device of claim 4, wherein the first electrode is a cathode electrode and the organic light emitting display device is a bottom emission mode organic light emitting display device.

\* \* \* \* \*